(12) United States Patent
Castleberry et al.

(10) Patent No.: US 7,559,012 B2
(45) Date of Patent: Jul. 7, 2009

(54) METHOD FOR ERROR DETECTION AND FLOW DIRECTION DETERMINATION IN A MEASURING METER

(75) Inventors: Walter Castleberry, Tallassee, AL (US); Jerry Lovett, Tallassee, AL (US); David Hamilton, Tallassee, AL (US); John Scarborough, Tallassee, AL (US); Tim Bianchi, Tallassee, AL (US)

(73) Assignee: Neptune Technology Group, Inc., Tallassee, AL (US)

( * ) Notice: Subject to any disclaimer, the term of this patent is extended or adjusted under 35 U.S.C. 154(b) by 400 days.

(21) Appl. No.: 10/701,027

(22) Filed: Nov. 4, 2003

(65) Prior Publication Data

US 2004/0123656 A1    Jul. 1, 2004

Related U.S. Application Data

(60) Provisional application No. 60/423,598, filed on Nov. 4, 2002.

(51) Int. Cl.
*G06F 11/00* (2006.01)
(52) U.S. Cl. ............... 714/812; 714/811; 714/706
(58) Field of Classification Search ............ 73/861; 714/784, 706, 811–812
See application file for complete search history.

(56) References Cited

U.S. PATENT DOCUMENTS

| | | | | |
|---|---|---|---|---|
| 2,689,950 | A | * | 9/1954 | Stenning et al. ......... 340/870.14 |
| 4,019,384 | A | * | 4/1977 | Herzl ...................... 73/861.24 |
| 4,538,119 | A | * | 8/1985 | Ashida ...................... 331/1 A |
| 4,953,386 | A | * | 9/1990 | Pearman et al. ............. 73/1.27 |
| 5,495,438 | A | * | 2/1996 | Omura ....................... 365/145 |
| 5,673,252 | A | * | 9/1997 | Johnson et al. ............. 370/449 |
| 5,963,551 | A | * | 10/1999 | Minko ....................... 370/356 |
| 6,357,034 | B1 | * | 3/2002 | Muller et al. ................ 714/784 |
| 6,509,841 | B1 | * | 1/2003 | Colton et al. ........... 340/870.11 |
| 6,542,832 | B1 | * | 4/2003 | LaMothe ..................... 702/45 |
| 6,710,721 | B1 | | 3/2004 | Holowick |
| 6,778,099 | B1 | | 8/2004 | Meyer |
| 6,798,352 | B2 | | 9/2004 | Holowick |

* cited by examiner

*Primary Examiner*—Cynthia Britt
*Assistant Examiner*—Steve Nguyen
(74) *Attorney, Agent, or Firm*—David E. Mixon; Bradley Arant Boult & Cummings LLP

(57) ABSTRACT

A method for correcting data signal errors in a meter has been developed. The method includes receiving ordered data signals from the meter. Next, the sequenced of ordered data signals is analyzed to determine whether a data signal is missing. Finally, if a data signal is missing, a predetermined value is added to a sequence counter to compensate for the missing signal.

10 Claims, 20 Drawing Sheets

| Sensor Input | Pulse Detection Output | Flow Direction Input |
|---|---|---|
| Sensor A+ | MEM A+ | A0 |
| Sensor B+ | MEM B+ | A1 |
| Sensor A- | MEM A- | A2 |
| Sensor B- | MEM B- | A3 |

FIG. 14a

| Tracking | Binary Address NA |
|---|---|
| Sensor A+ | 00 *(0 decimal)* |
| Sensor B+ | 01 *(1 decimal)* |
| Sensor A- | 10 *(2 decimal)* |
| Sensor B- | 11 *(3 decimal)* |

FIG. 14b

| Sensor Input | Binary Address NA |
|---|---|
| Sensor A+ | 00 *(0 decimal)* |
| Sensor B+ | 01 *(1 decimal)* |
| Sensor A- | 10 *(2 decimal)* |
| Sensor B- | 11 *(3 decimal)* |
| Sensor A+ | 00 *(0 decimal)* |
| Sensor B+ | 01 *(1 decimal)* |
| Sensor A- | 10 *(2 decimal)* |

FIG. 15a

| Sensor Input | Binary Address NA |
|---|---|
| Sensor A+ | 00 *(0 decimal)* |
| Sensor B- | 11 *(3 decimal)* |
| Sensor A- | 10 *(2 decimal)* |
| Sensor B+ | 01 *(1 decimal)* |
| Sensor A+ | 00 *(0 decimal)* |
| Sensor B- | 11 *(3 decimal)* |
| Sensor A- | 10 *(2 decimal)* |

FIG. 15b

| Occurring Pulse | New Address NA | Previous Address PA | Subadd |
|---|---|---|---|
| Sensor A+ | 00 | 11 | 00-11= 01 |
| Sensor B+ | 01 | 00 | 01-00= 01 |
| Sensor A- | 10 | 01 | 10-01= 01 |
| Sensor B- | 11 | 10 | 11-10= 01 |
| Sensor A+ | 00 | 11 | 00-11= 01 |
| Sensor B+ | 01 | 00 | 01-00= 01 |
| Sensor A- | 10 | 01 | 10-01= 01 |
| Sensor B- | 11 | 10 | 11-10= 01 |

FIG. 16a

| Occurring Pulse | New Address NA | Previous Address PA | Subadd |
|---|---|---|---|
| Sensor A+ | 00 | 01 | 00-01= 11 |
| Sensor B- | 11 | 00 | 11-00= 11 |
| Sensor A- | 10 | 11 | 10-11= 11 |
| Sensor B+ | 01 | 10 | 01-10= 11 |
| Sensor A+ | 00 | 01 | 00-01= 11 |
| Sensor B- | 11 | 00 | 11-00= 11 |
| Sensor A- | 10 | 11 | 10-11= 11 |
| Sensor B+ | 01 | 10 | 01-10= 11 |

FIG. 16b

| Pulse | New Address | Previous Address | Subadd |
|---|---|---|---|
| Sensor A+ | 00 | | |
| Sensor B+ | Missing | *************** | *************** |
| Sensor A- | 10 | 00 | 10-00= 10 |
| | | | |
| Sensor B+ | 01 | | |
| Sensor A- | Missing | *************** | *************** |
| Sensor B- | 11 | 01 | 11-01= 10 |
| | | | |
| Sensor A- | 10 | | |
| Sensor B- | Missing | *************** | *************** |
| Sensor A+ | 00 | 10 | 00-10= 10 |
| | | | |
| Sensor B- | 11 | | |
| Sensor A+ | Missing | *************** | *************** |
| Sensor B+ | 01 | 11 | 01-11= 10 |

FIG. 17a

| Pulse | New Address | Previous Address | Subadd |
|---|---|---|---|
| Sensor A+ | 00 | | |
| Sensor B- | Missing | *************** | *************** |
| Sensor A- | 10 | 00 | 10-00= 10 |
| | | | |
| Sensor B- | 11 | | |
| Sensor A- | Missing | *************** | *************** |
| Sensor B+ | 01 | 11 | 01-11= 10 |
| | | | |
| Sensor A- | 10 | | |
| Sensor B+ | Missing | *************** | *************** |
| Sensor A+ | 00 | 10 | 00-10= 10 |
| | | | |
| Sensor B+ | 01 | | |
| Sensor A+ | Missing | *************** | *************** |
| Sensor B- | 11 | 01 | 11-01= 10 |

FIG. 17b

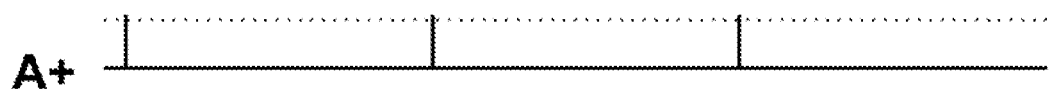
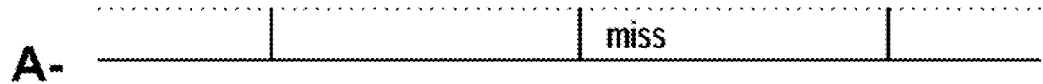
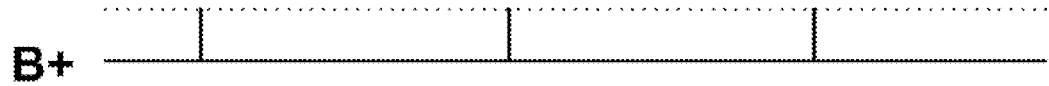
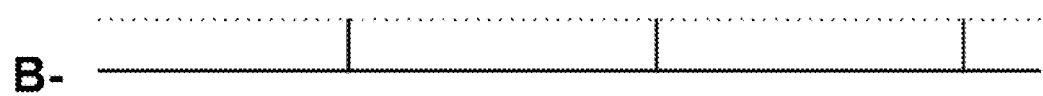
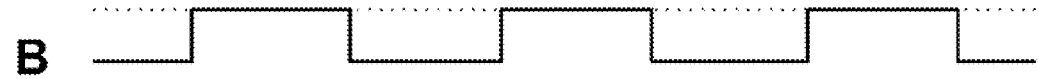
| State | 10 | 11 | 01 | 00 | 10 | 11 | | 10 | 10 | 11 | 01 | 00 |
|---|---|---|---|---|---|---|---|---|---|---|---|---|
| Magnet Angle | 0 | 45 | 90 | 135 | 180 | 225 | 270 | 315 | 0 | 45 | 90 | 135 |
| | | | | | | | | | | | | |
| LVD | 1 | 1 | 1 | 1 | 1 | 1 | | 1 | 0 | 1 | 1 | 1 |
| Action | +1 | +1 | +1 | +1 | +1 | +1 | | | -1 | +4 | +1 | +1 | +1 |
| REG UP | 1 | 2 | 3 | 4 | 5 | 6 | | 6 | 10 | 11 | 12 | 13 |
| REG DN | 0 | 0 | 0 | 0 | 0 | 0 | | 1 | 1 | 1 | 1 | 1 |
| Net | 1 | 2 | 3 | 4 | 5 | 6 | | 5 | 9 | 10 | 11 | 12 |
FIG. 18

METHOD FOR ERROR DETECTION AND FLOW DIRECTION DETERMINATION IN A MEASURING METER

CROSS-REFERENCE TO RELATED APPLICATIONS

This application claims priority from U.S. Provisional Application No. 60/423,598 for "Electronic Coding Self Powered Water Meter" that was filed on Nov. 4, 2002.

BACKGROUND OF INVENTION

1. Field of the Invention

The invention relates generally to measuring meters. More specifically, the invention relates to flow direction and error detection protocols of a data recorder for a measuring meter.

2. Background Art

Meters that measure usage of a material based on flow are widely used to keep track of the consumption of an end user. For example, utility companies that supply water to their customers typically charge for their product based on usage. Usage of water is typically measured by a meter that is installed for each individual customer on their respective water supply line. A utility company employee periodically (usually once a month) manually collects the reading from the meter. These readings are usually cumulative, so the amount of usage for the present period is calculated by subtracting the reading from the previous period. Once the usage is calculated, the customer is billed for that amount of water used during that period.

Manually reading water usage meters is labor intensive, time consuming expensive, and subject to human error especially for residential customers because each meter monitors relatively little water usage as compared with larger, commercial customers. As a result, electronic meters have been used to allow for quicker, more efficient, and more accurate collection of water usage data. The electronic meters measure water usage by monitoring the water flow through a conventional, mechanical fluid meter. The usage readings are stored electronically and then transmitted via radio signals to a local transmitter/receiver operated by the utility.

However, electronic meters require a power source. Typically, such a meter relies on a battery for power. The battery must be replaced manually, which is another time consuming and expensive process. Additionally, if the battery fails, the utility may be unable to determine the correct water usage at the meter and consequently under bill the customer.

SUMMARY OF INVENTION

In some aspects, the invention relates to a method for correcting data signal errors in a meter, comprising: receiving ordered data signals from the meter; analyzing the sequence of the ordered data signals to detect a missing signal; and compensating for the missing data signal by adding a predetermined value to a sequence counter.

In other aspects, the invention relates to a method for correcting data signal errors in a meter, comprising: receiving ordered data signals from the meter; analyzing the sequence of the ordered data signals to detect a missing signal; and compensating for the missing data signal by adjusting a variable that indicates the last valid direction of the meter.

In other aspects, the invention relates to a method for detecting errors in a meter, comprising: step for receiving a sequence of data signals of the meter; step for analyzing the sequence of data signals to detect a missing data signal; and step for compensating for a missing data signal.

Other aspects and advantages of the invention will be apparent from the following description and the appended claims.

BRIEF DESCRIPTION OF DRAWINGS

It should be noted that identical features in different drawings are shown with the same reference numeral.

FIG. 14a shows a chart of corresponding Sensor inputs, Signal detection outputs, and Flow direction inputs in accordance with one embodiment of the present invention.

FIG. 14b shows a chart that indicates the binary addresses of an occurring signal in accordance with one embodiment of the present invention.

FIG. 15a shows a chart that indicates the sequence of binary address values when the meter flow is running forward in accordance with one embodiment of the present invention.

FIG. 15b shows a chart that indicates the sequence of binary address values when the meter flow is running in reverse in accordance with one embodiment of the present invention.

FIG. 16a shows a chart that indicates the SUBADD value when the meter is running forward in accordance with one embodiment of the present invention.

FIG. 16b shows a chart that indicates the SUBADD value when the meter is running in reverse in accordance with one embodiment of the present invention.

FIG. 17a shows a chart that indicates the SUBADD values for a missing signal when the meter flow is running forward in accordance with one embodiment of the present invention.

FIG. 17b shows a chart that indicates the SUBADD values for a missing signal when the meter flow is running in reverse in accordance with one embodiment of the present invention.

FIG. 18 shows a chart that indicates the states of Sensor A and Sensor B with a missed signal and no change in flow direction in accordance with one embodiment of the present invention.

DETAILED DESCRIPTION

A measuring meter with an error detection and flow direction determination protocol has been developed. The measuring meter measures and records volumetric usage of a material as it passes through the meter. The meter could be used in utility applications to measure water, gas or electricity usage. Additionally, such meters are commonly used in industrial applications to measure the flowrates of various components. In this section, a self-powered water meter in a utility application will be used to describe various embodiments of the present invention. However, it should be understood that the invention as described, can be applied to many different types of measuring meters in a wide variety of applications.

Figure 1:
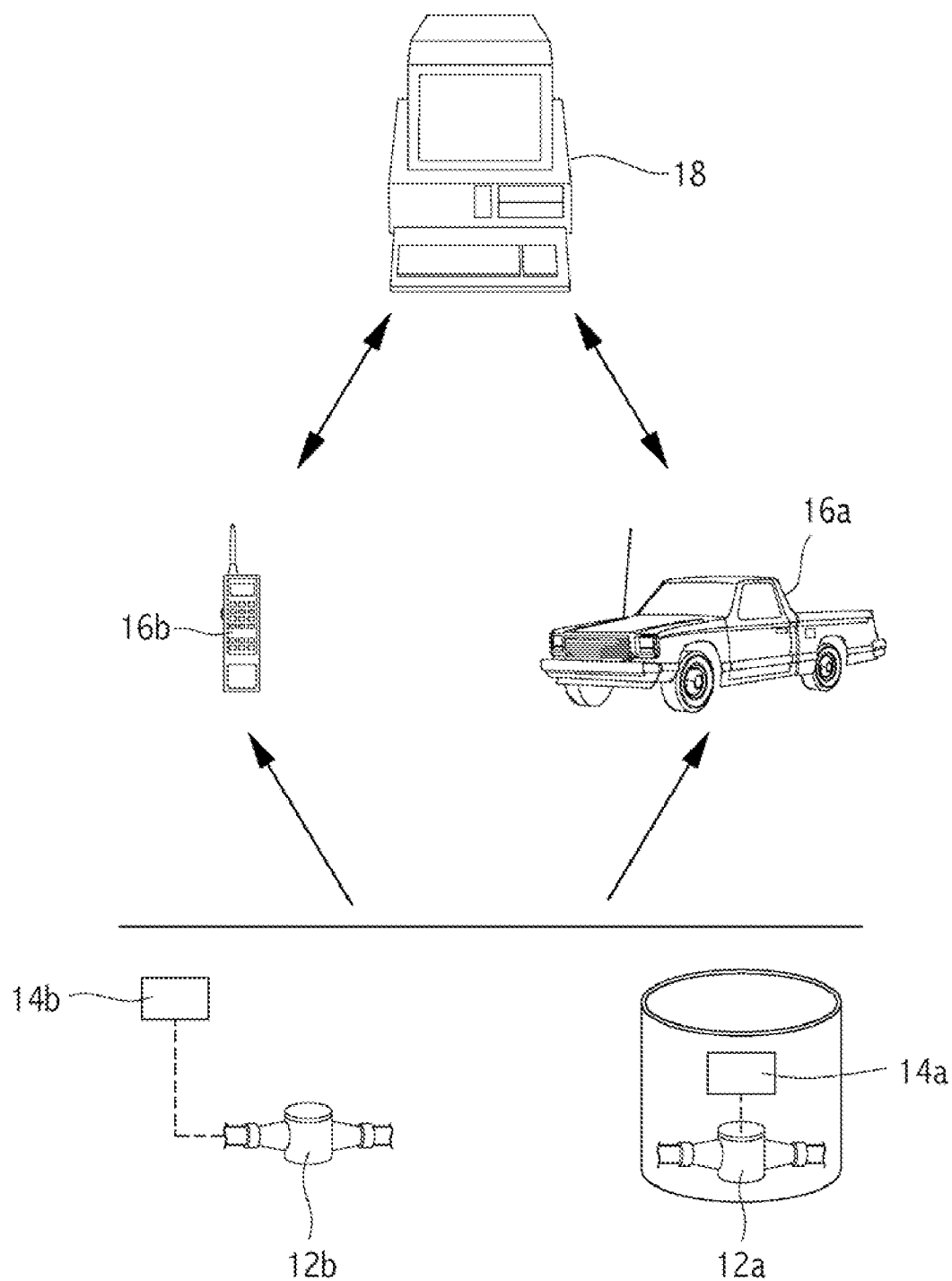
FIG. 1 shows a diagram of an electronic water meter monitoring system in accordance with one embodiment of the present invention.

FIG. 1 shows a diagram of an electronic water meter monitoring system 10 in accordance with one embodiment of the present invention. The system 10 includes an electronic water meter 12a or 12b for an individual customer. The meter is typically located at a point on the customer's individual supply line between the customer and utility's main supply line. A meter interface unit (MIU) 14a or 14b is connected to the respective meter 12a or 12b. The MIU 14a or 14b is an electronic device that collects meter usage data from an electronic register on its respective meter and transmits the data to a local transmitter/receiver 16a or 16b via radio signals. In alternative embodiments, other external devices could be used such as a laptop computer, a data logger, or other suitable device known in the art. Two alternative embodiments of the electronic water meters are shown. The first embodiment includes a meter 12a and MIU 14a that are located underground or a "pit" unit. The other embodiment includes a meter 12b and MIU 14b that are located above ground. Two alternative types of transmitter/receivers 16a and 16b are also shown. The first transmitter/receiver 16a is mounted in a vehicle while the other transmitter/receiver is a handheld unit 16b. An additional type of transmitter/receiver may be permanently mounted at a location central to multiple meters and MIUs. Each of these transmitter/receivers allows utility personnel to receive usage data without manually reading each individual meter. Instead, when each transmitter/receiver 16a and 16b is within range of a MIU 14a or 14b, the data from the meter is transmitted to the transmitter/receiver that in turn transmits it to the computer system of the utility 18. The computer system 18 then calculates the usage of each customer based on the data. Appropriate billing for each customer is then generated by the utility.

The electronic water meters of the system are self-powered by an internal "Wiegand Wire". The Wiegand Wire is a device that generates electrical signals when it is exposed to a magnetic field with changing flux polarity. The wire may also be used to induce voltage across a coil located near the wire. The polarity of the magnetic field is changed by relying on the kinetic energy of the fluid moving through the meter. In some embodiments, the fluid turns an internal water wheel that in turn rotates an attached shaft as it moves through the meter. Multiple magnets are arranged on a circular disc that is attached to the rotating shaft. As the circular disc rotates along with the shaft, the movement of the magnets induces alternating fields of magnetic flux within the Wiegand Wire that is located in close proximity to the disc. The signals generated by the wire due to the changes in the magnetic flux are used to power the electronic circuits that monitor the meter. The rate, volume, and direction of fluid flow through the meter may also be determined by analyzing the number and rate of signals generated by the wire.

Figure 2:
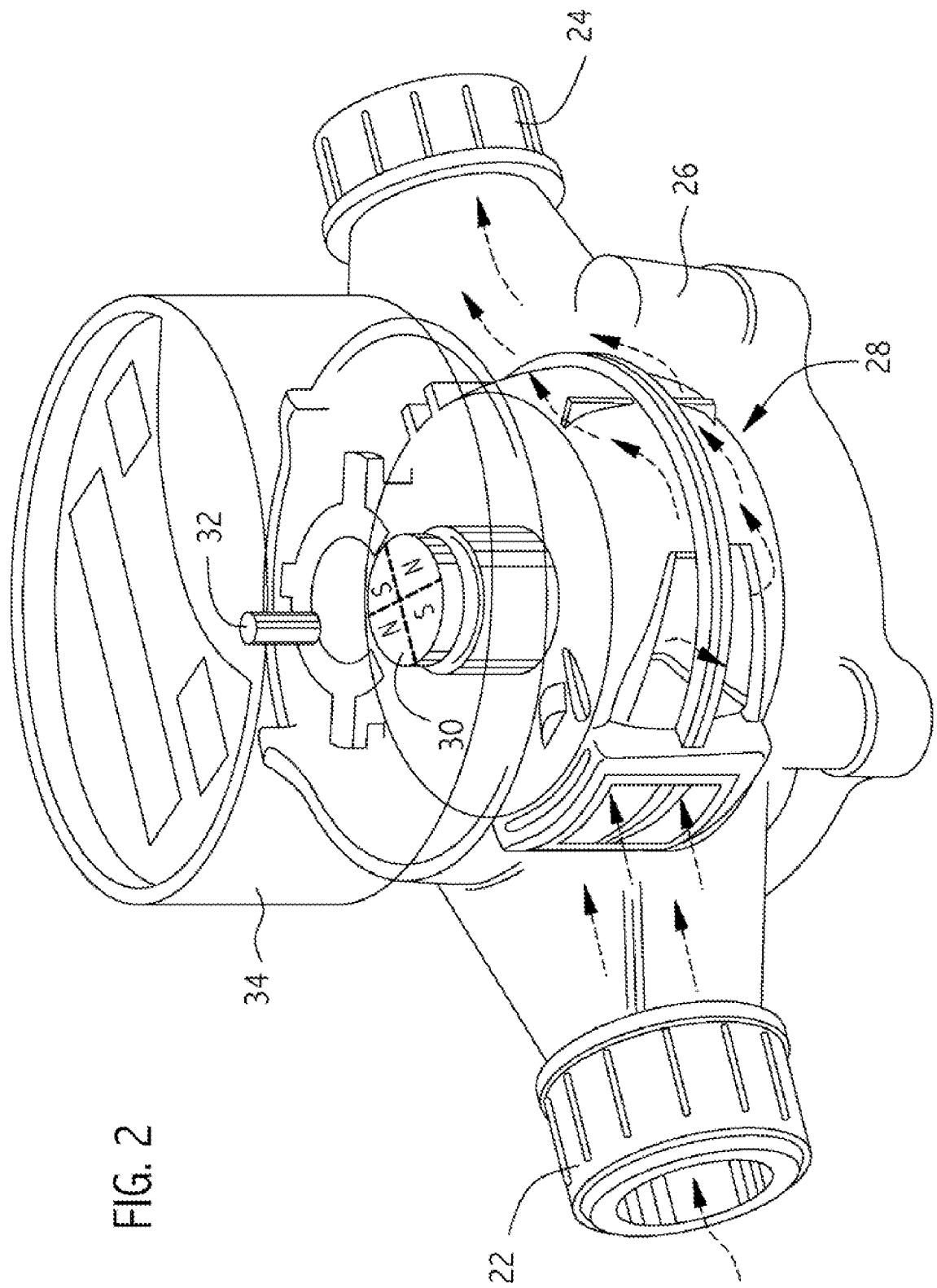
FIG. 2 shows a cut-away diagram of a self-powered water meter in accordance with one embodiment of the present invention.

FIG. 2 shows a cut-away diagram of a self-powered electronic water meter 20 in accordance with one embodiment of the present invention. In this embodiment, the electronic water meter 20 is connected to a water supply line at the meter's inflow connector 22. Water flows from the supply line through the connector 22 into the meter body 26 and out through the outflow connector 24 to the customer. As the water flows through the meter body 26, it forces an internal flow wheel 28 to rotate. The rotating flow wheel 28 in turn rotates a circular magnetic disc 30 that is connected to the flow wheel 28 by a shaft (not shown). The disc 30 in this embodiment is shown with four separate magnetic zones (labeled "N" and "S" for the polar orientation of each zone) that make up a four-pole magnet. In other embodiments, different configurations of magnets could be used.

As the magnetic disc 30 rotates, it changes the magnetic flux polarity for the Wiegand Wire sensor 32 that is located adjacent to the disc 30. As described previously, the changes in polarity induce signals that are generated by the sensor 32. These signals represent data concerning the water flow through the meter 20 and also provide power to the electronic circuits of the meter. Specifically, the stream of signals corresponds to the rate and direction of the water flow through the meter. The flow rate of the water through the meter 20 is calibrated to the rate of rotation of the flow wheel 28, the magnetic disc 30, and the signal stream generated by the sensor 32. In FIG. 2, only one Wiegand Wire sensor 32 is shown in use with the meter 20. It should be understood that multiple sensors could be used in a meter for alternative embodiments of the present invention.

Figure 3:
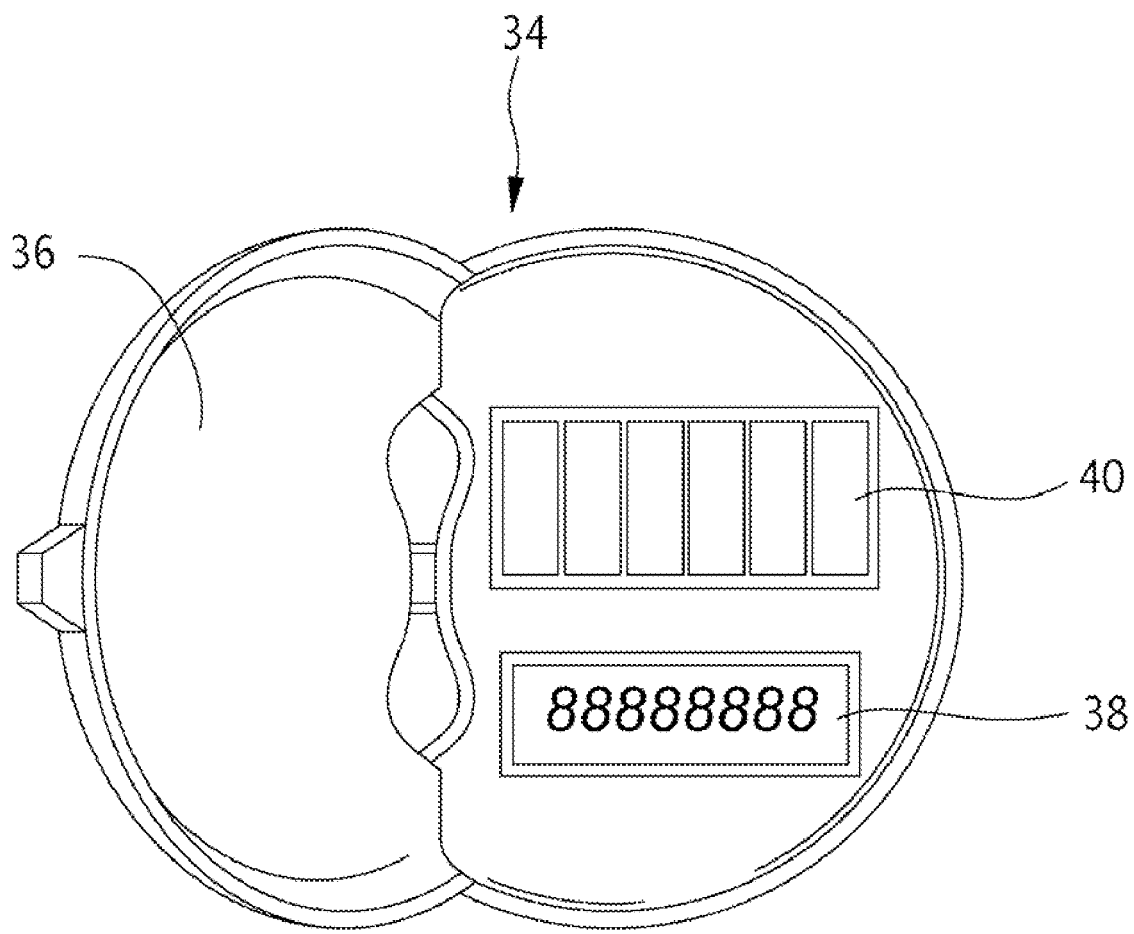
FIG. 3 shows a view of the display of an electronic data recorder in accordance with one embodiment of the present invention.

The data is processed and stored in an electronic data recorder 34 that is attached to the meter 20. The recorder 34 contains an ASIC (Application Specific Integrated Circuit) chip that processes the data. In some embodiments, non-volatile memory, which serves to store the data, is located within the ASIC. In this example, the memory is non-volatile which is memory that will not lose its stored data when power is removed. Examples of non-volatile memory include: core memory; ROM; EPROM; flash memory; bubble memory; battery-backed CMOS-RAM; etc. In this example, the non-volatile memory is a ferro-electric RAM ("FeRAM"). This type of memory is typically used in mobile applications. It is also may be used in applications that are very demanding in terms of minimizing power usage while maximizing performance. In still other embodiments, non-volatile logic or other non-volatile structures could be used. FIG. 3 shows a view of the display of the top of the electronic data recorder 34. The recorder 34 has a cover 36 (shown in the open position) that protects the display 38 from dirt, debris, etc. The display 38 itself is an LCD (Liquid Crystal Display) that shows data. In the present embodiment, nine digits may be shown by the LCD. In alternative embodiments, other types and numbers of display schemes could be used. The display is power by bank of solar cells 40 that are exposed to sunlight when the cover 36 is opened. The display is convenient to use in case a manual reading of the meter is necessary due to failure of an MIU or other system component.

Figure 4:
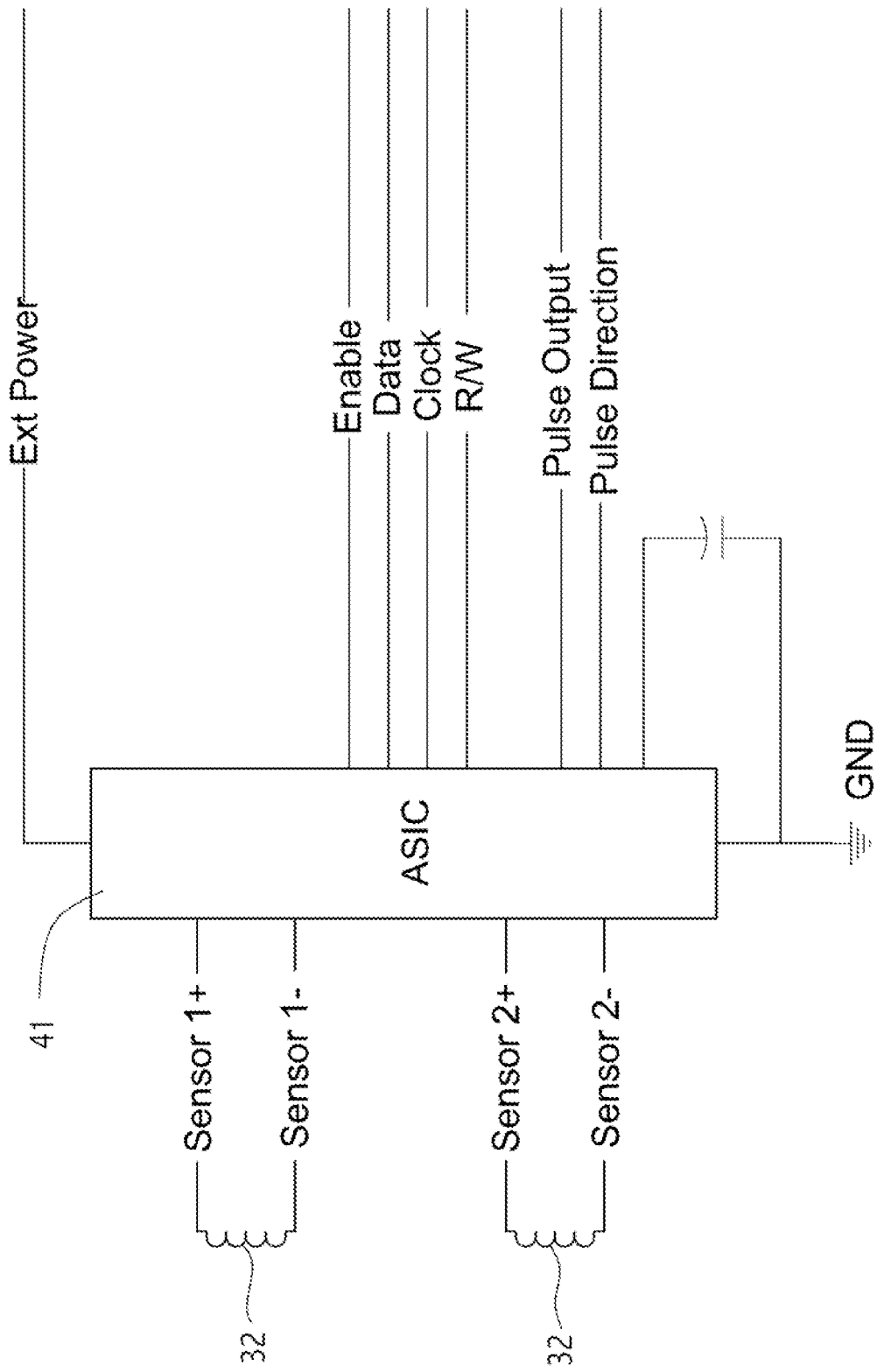
FIG. 4 shows a block diagram of the ASIC circuitry of the electronic data recorder in accordance with one embodiment of the present invention.

FIG. 4 shows a block diagram of the ASIC circuitry of the electronic data recorder. In this embodiment, two Wiegand Wire sensors 32 are used to supply two separate data streams to the ASIC 41. Each sensor 32 produces a separate positive ("+") and a negative ("−") data stream. Other connections to the ASIC include a power supply (EXT POWER) that is external to the ASIC and a ground (GND) connection. In this embodiment, the two Wiegand Wire sensors 32 generate the external power supply. Other connections for the ASIC include: an enable signal (ENABLE); a data signal (DATA); a clock signal (CLOCK); a read/write signal (R/W); a output signal (PULSE OUTPUT); and a signal direction signal (PULSE DIRECTION). Each of these signals connections passes through a host interface (not shown) to rest of the data recorder.

Figure 5A:
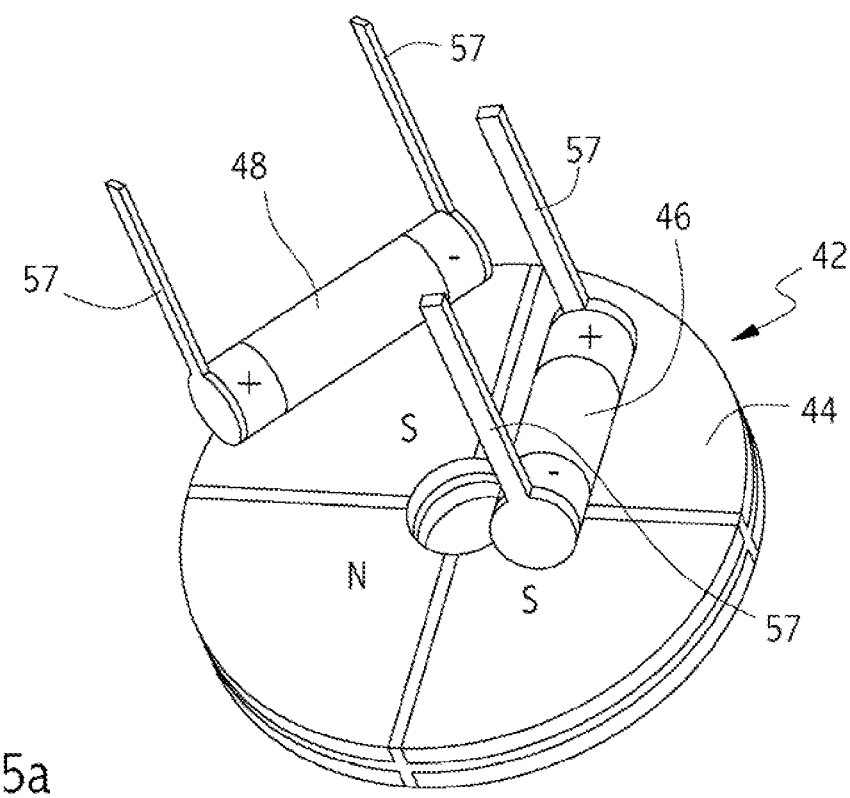
FIG. 5a shows a perspective view of two Wiegand Wire sensors with a four-pole magnet in accordance with one embodiment of the present invention.
Figure 5B:
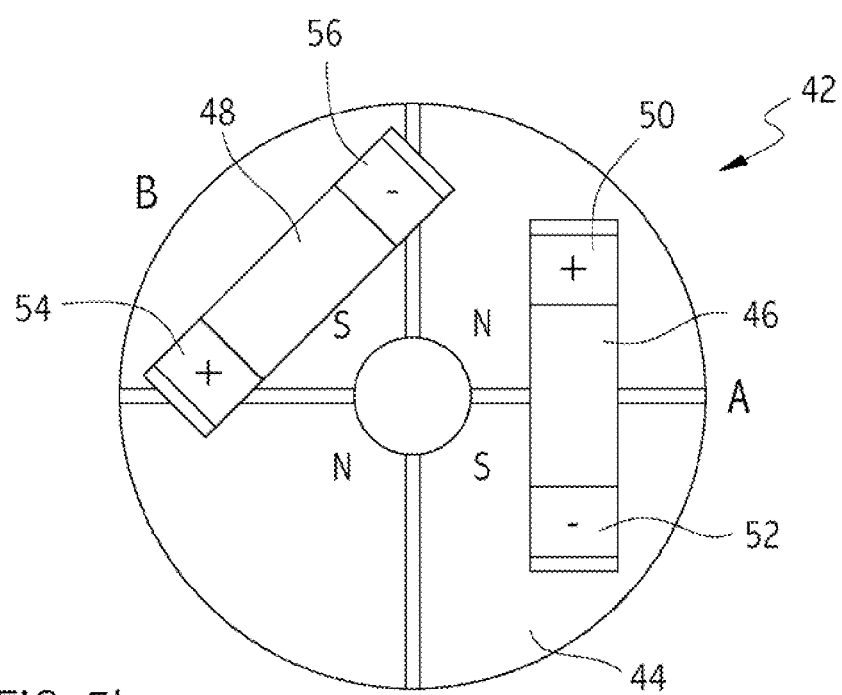
FIG. 5b shows an overhead view of two Wiegand Wire sensors with a four-pole magnet in accordance with one embodiment of the present invention.

FIGS. 5a and 5b show views of one embodiment of a four-pole magnet with two Wiegand Wire sensors 42. The magnet 44 is a circular-shaped disc with a surface divided into four sections. The sections represent the two polarities of the magnet: either North ("N") or South ("S"). The surface of each magnet 44 has two alternating N sections and two alternating S sections. The two sensors are labeled Sensor A 46 and Sensor B 48. In this example, the sensors 46 and 48 are placed apart at a 135° angle. Each sensor has a positive terminal 50 and 54 and a negative terminal 52 and 56. Each sensor terminal 50, 52, 54, and 56 has an attached lead 57 that in turn may be connected to a monitor such as an oscilloscope to determine the value the sensor output.

Figure 6A:
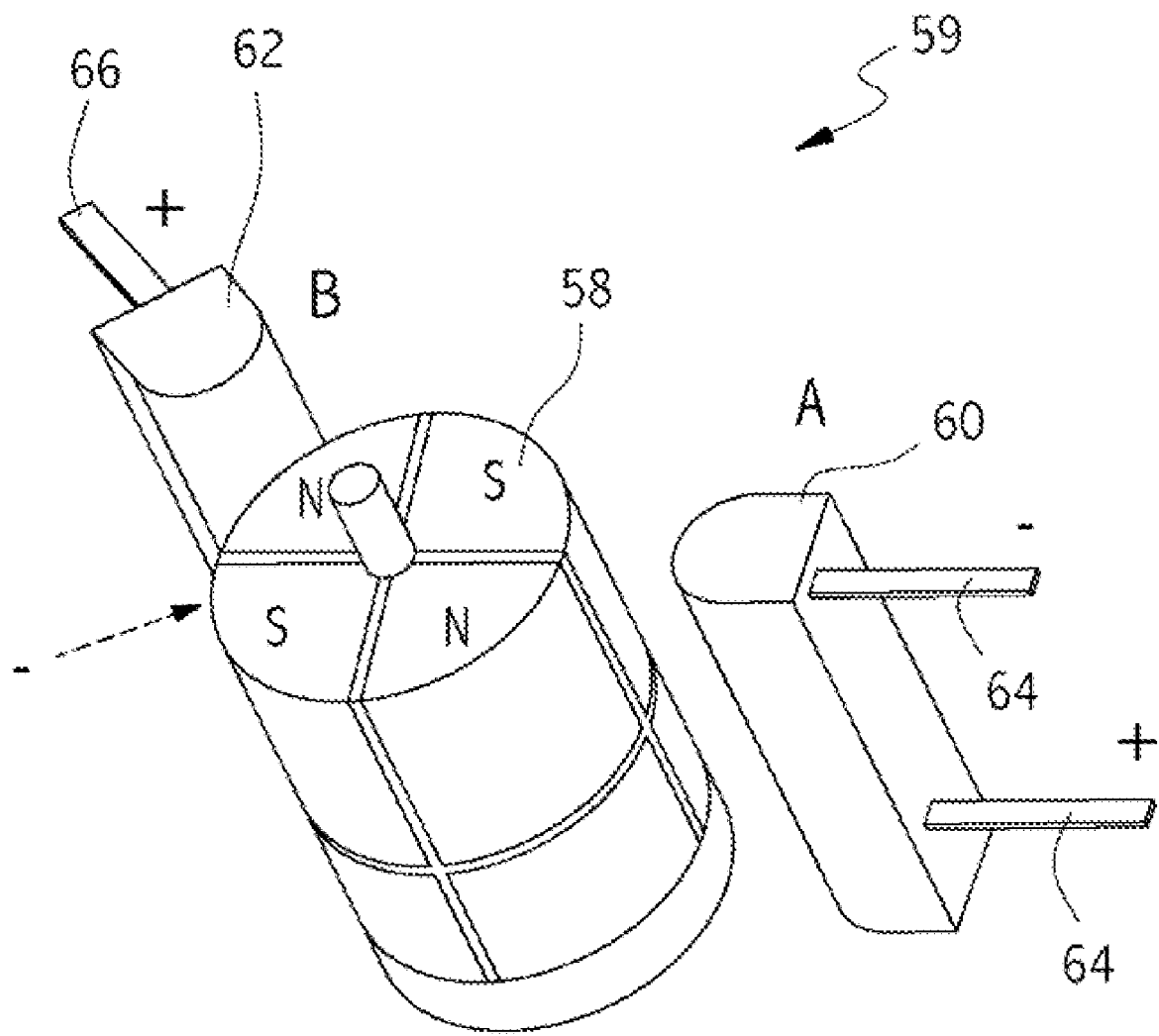
FIG. 6a shows a perspective view of two Wiegand Wire sensors with a four-pole magnet in accordance with an alternative embodiment of the present invention.
Figure 6B:
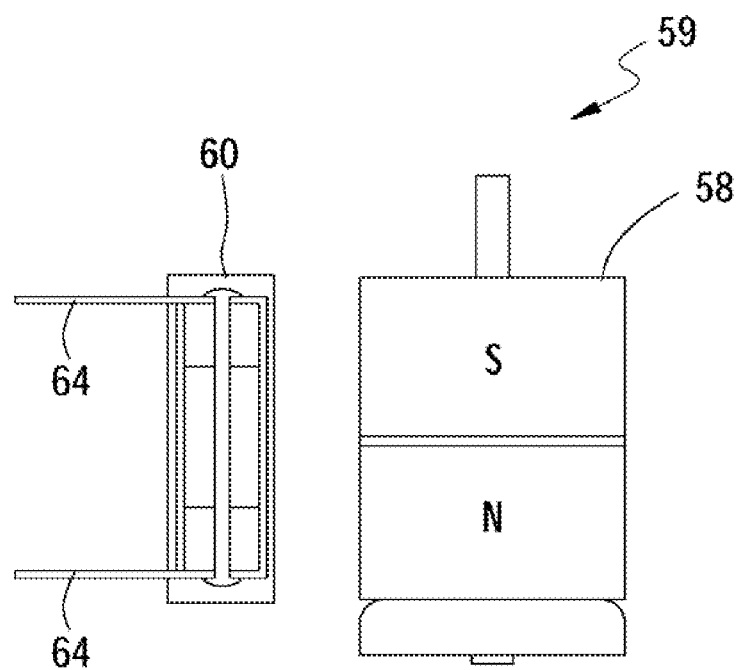
FIG. 6b shows a side view of two Wiegand Wire sensors with a four-pole magnet in accordance with an alternative embodiment of the present invention.
Figure 6C:
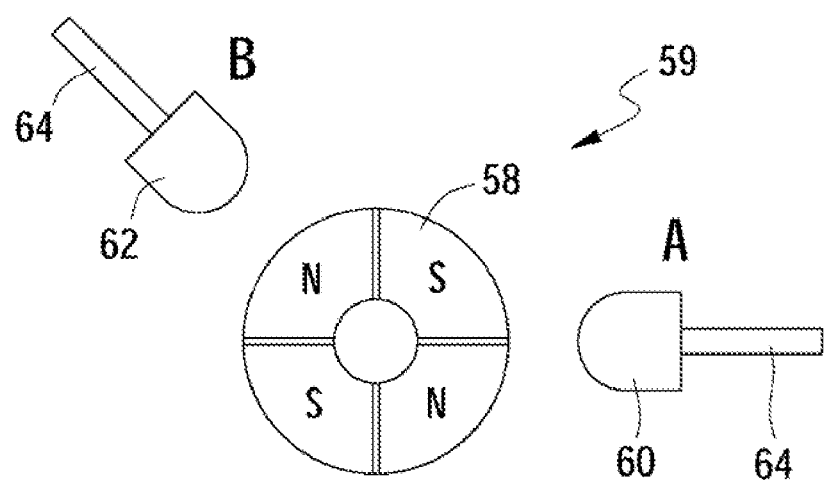
FIG. 6c shows an overhead view of two Wiegand Wire sensors with a four-pole magnet in accordance with an alternative embodiment of the present invention.

FIGS. 6a, 6b, and 6c show an alternative configuration of a four-pole magnet with two Wiegand Wire sensors 59. In this embodiment, the magnet 58 is cylindrical-shaped. The magnet 58 has two sensors 60 and 62 located parallel to the length of the cylinder. The sensors are labeled Sensor A 60 and Sensor B 62 and are placed apart at a 135° angle. Each sensor has a positive terminal and a negative terminal that is connected to an external monitor with leads 64. The cylindrical surface of the magnet 58 is divided into upper and lower segments which each have four sections of alternating polarity for a total eight magnetized polarity zones. The values of the sensor outputs in this embodiment 59 will be the same as the disc-shaped magnet embodiment 42 shown in FIGS. 5a and 5b.

Figure 7:
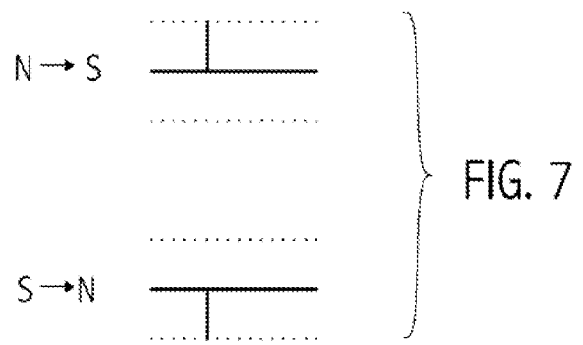
FIG. 7 shows a signal generated by a Wiegand Wire sensor during a transition from a N polar section of a magnet to a S polar section of a magnet and a signal generated during a transition from a S polar section of a magnet to a N polar section of a magnet in accordance with one embodiment of the present invention.
Figure 8:
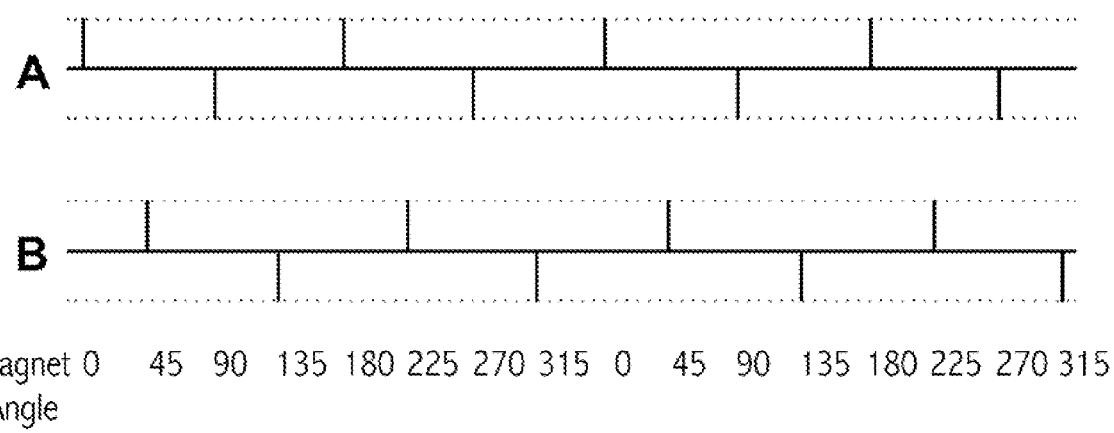
FIG. 8 shows a graph of the outputs of Sensor A and Sensor B in relation to the amount of angular rotation of the magnet in accordance with one embodiment of the present invention.

Referring back to FIG. 5b, if the magnet 44 rotates in a counter-clockwise direction, the N polar section under Sensor A 46 will transition to Sensor B 48. As the N polar section of the magnet 44 transitions to the following S polar section, a positive signal is generated as shown in FIG. 7 ("N→S"). The magnet 44 will rotate approximately 45° between a positive signal of Sensor A 46 and a positive signal of Sensor B 48. As the magnet 44 continues to rotate counter clockwise, the S polar section will transition to the other N polar section. This transition ("S→N") will generate a negative signal as shown in FIG. 7. Once again, the magnet 44 will rotate approximately 45° between a negative signal of Sensor A 46 and a negative signal of Sensor B 48. FIG. 8 shows a graph of the outputs of Sensor A and Sensor B in relation to the amount of angular rotation of the magnet. As the magnet rotates 180°, a total of four signals will have been generated: one positive and one negative for each of the two sensors. After the magnet has completed a full revolution of 360°, a total of eight signals will have been generated: two positive and two negative for each of the two sensors.

Figure 9:
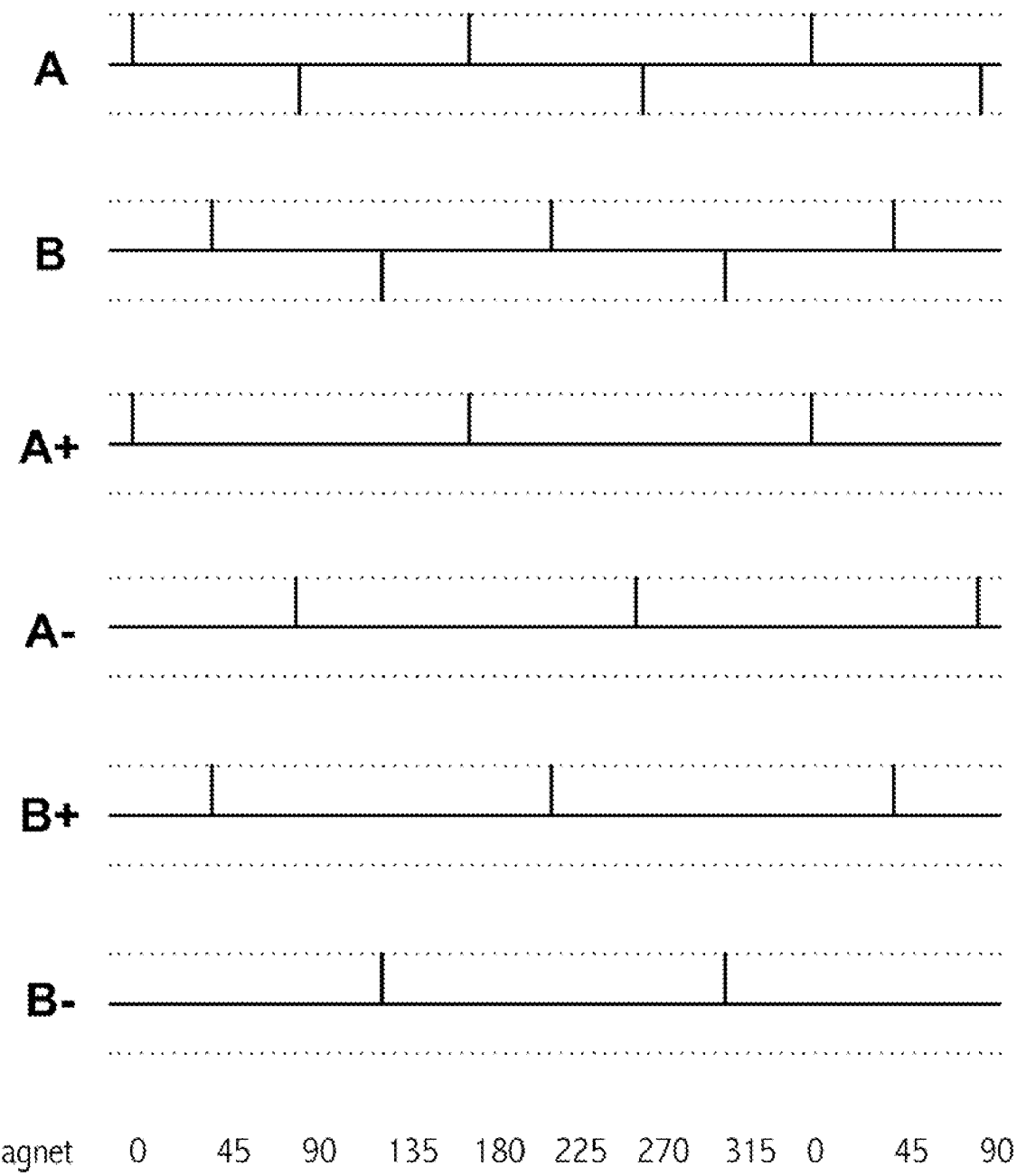
FIG. 9 shows a graph of the separation of the outputs of Sensor A and Sensor B into four separate channels in accordance with one embodiment of the present invention.

In order to better determine how the magnet is moving, the outputs of Sensor A and Sensor B may be broken up into four separate channels. Each sensor is divided into a positive and a negative output (I.e., A+, A−, B+, and B−). FIG. 9 shows a graph of the separation of the outputs of Sensor A and Sensor B into four separate channels in comparison with the original signals. Splitting the signals is done with an electronic circuit that divides the signals into positive and negative channels. The negative signals are then rectified or changed into positive signals in their respective channel.

Figure 10:
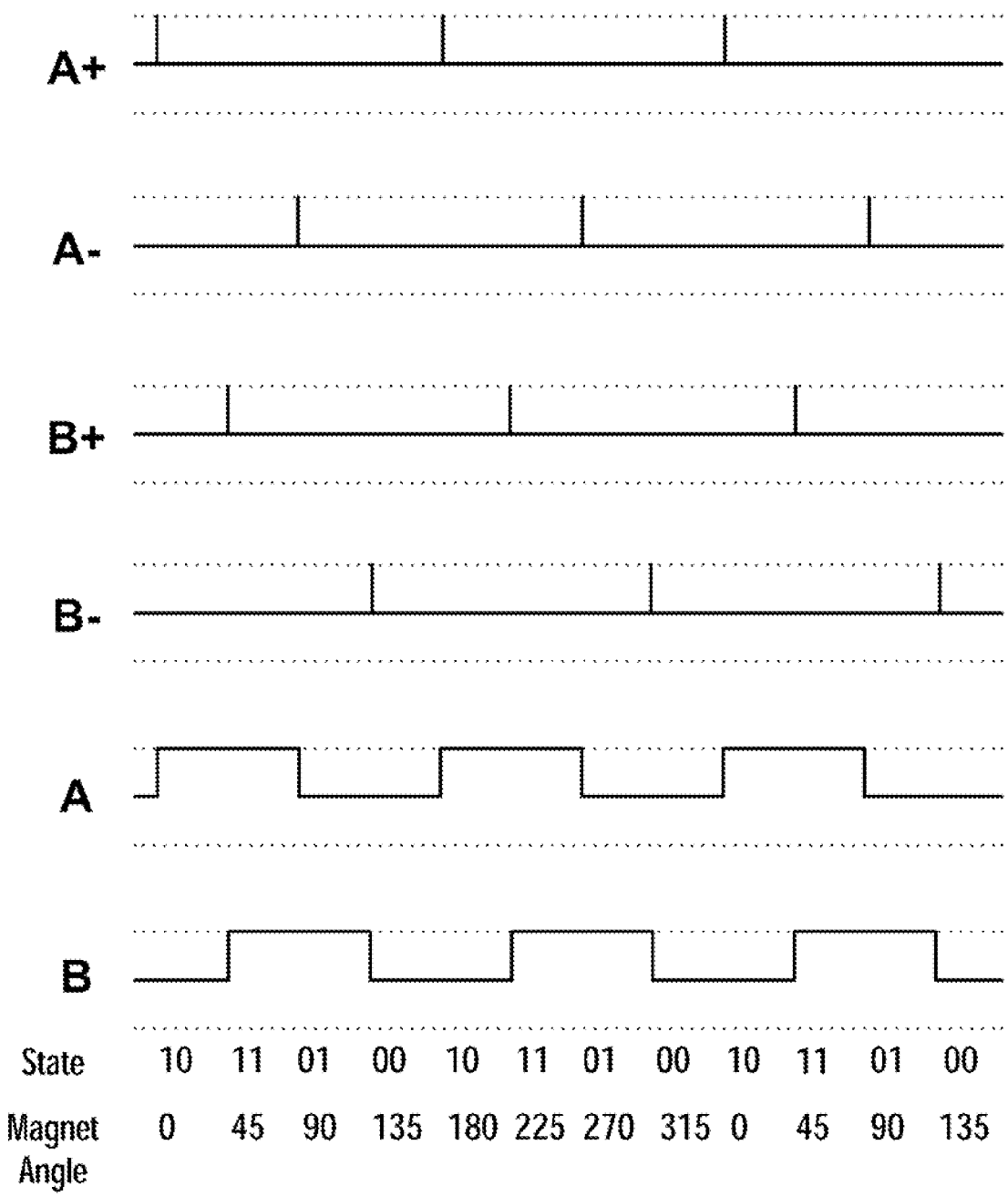
FIG. 10 shows a graph of the state of Sensor A and Sensor B when the magnet is turning counter-clockwise that is obtained from the four channel outputs of the sensors in accordance with one embodiment of the present invention.

Once the signals of Sensor A and Sensor B are broken up into four channels, these channels may be converted into a state indicator for each sensor as shown in FIG. 10. The state of each sensor is indicated by an output (i.e., either HIGH or LOW), with the state being HIGH after a positive signal and LOW after a negative signal. The state of both sensors may be indicated by the value of a two bit binary value (i.e., either "1" or "0") with 1 corresponding to HIGH and 0 corresponding to LOW. In the two digit number that indicates the state of both sensors, the first or most significant digit represents the state of Sensor A while the second or least significant digit represents the state of Sensor B.

Figure 11:
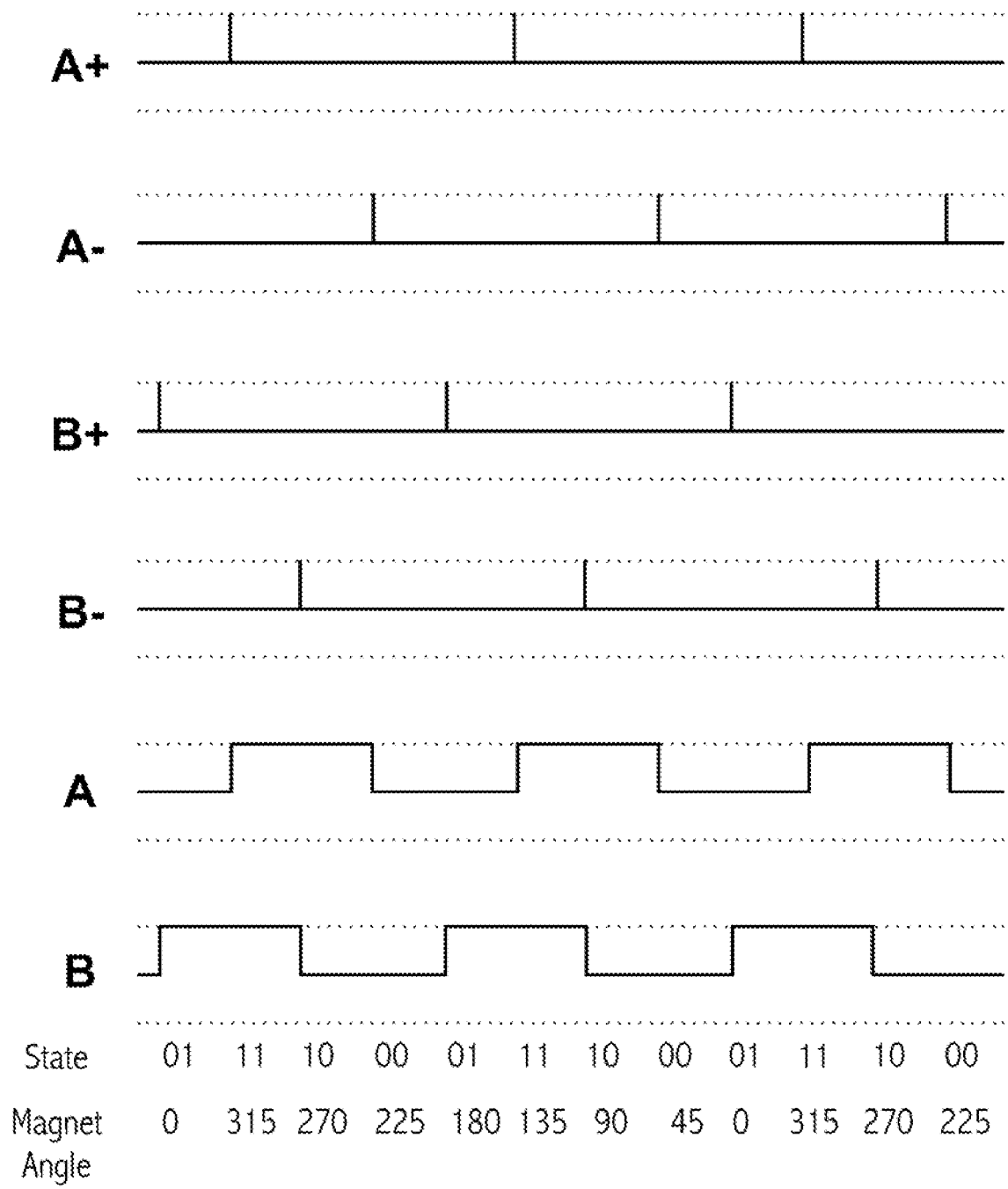
FIG. 11 shows a graph of the state of Sensor A and Sensor B when the magnet is turning clockwise that is obtained from the four channel outputs of the sensors in accordance with one embodiment of the present invention.
Figure 12:
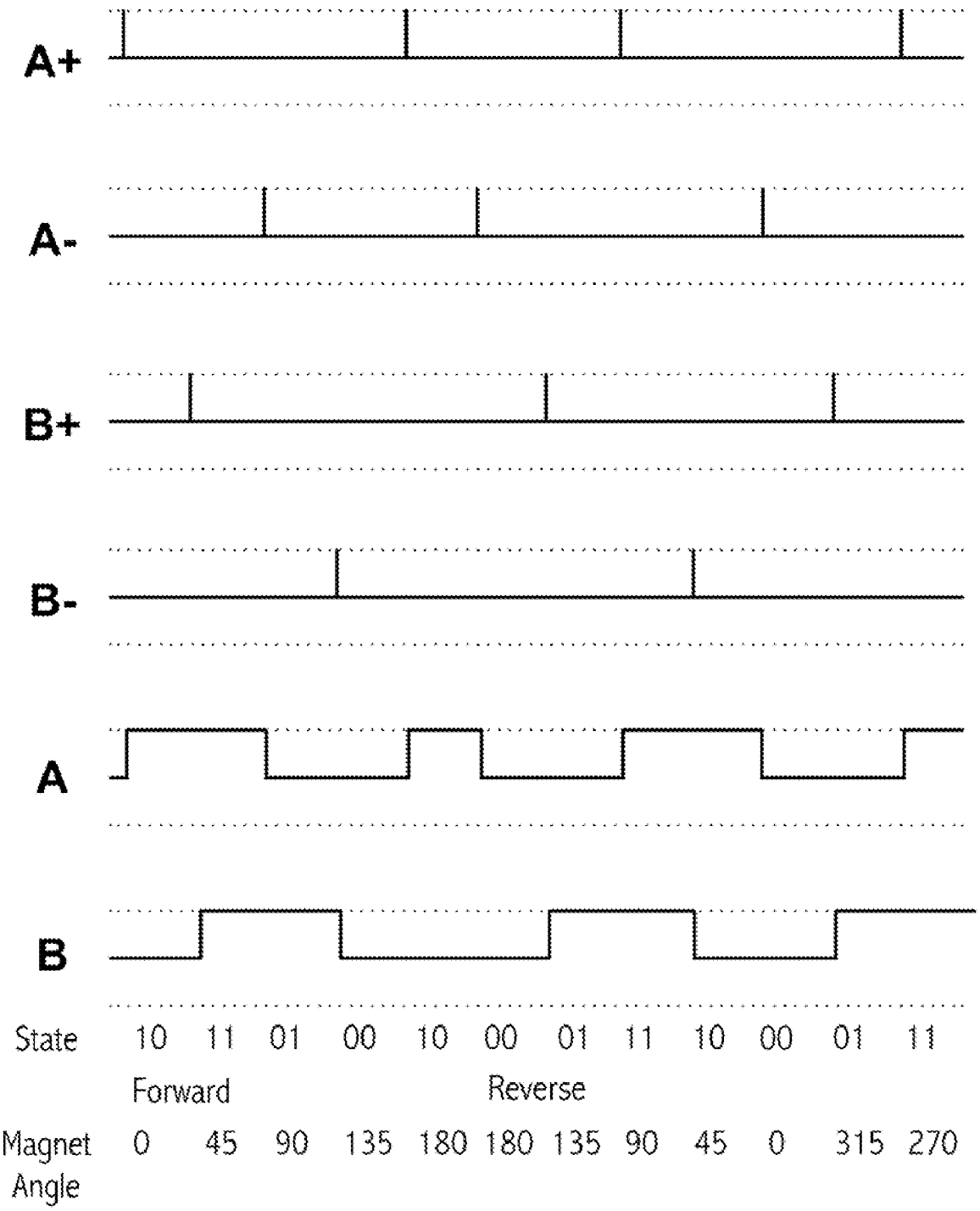
FIG. 12 shows a graph of the state of Sensor A and Sensor B when the magnet is turning counter-clockwise and reverses to turning clockwise that is obtained from the four channel outputs of the sensors in accordance with one embodiment of the present invention.

As shown the FIG. 10, the A bit value is leading while the B bit value is trailing when the magnet is rotating in a counter-clockwise direction. However, FIG. 11 shows a set of corresponding values when the magnet is turning in a clockwise direction. In this example, the B bit value is leading while the A bit value is trailing. The specific sequence of the binary state indicators are unique for the specific direction of flow through the meter. In this example, the states shown in FIG. 10 are indicative of forward flow through the meter and the states shown in FIG. 11 are indicative of a reversal of flow direction through the meter. FIG. 12 shows an example of a set of values where the direction of flow is reversed from counter-clockwise to clockwise after an initial rotation of 180° by the magnet.

Figure 13:
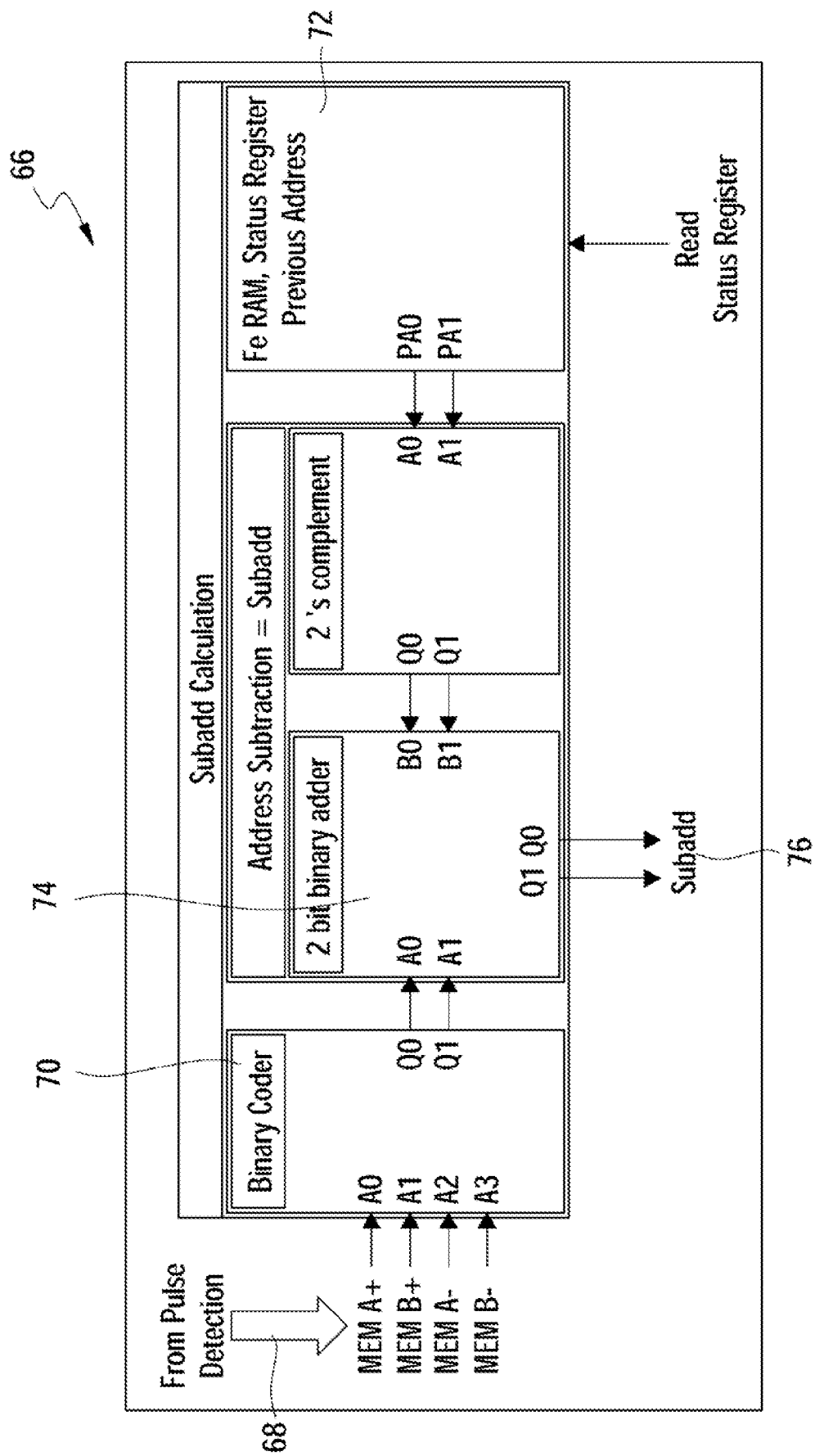
FIG. 13 shows a block diagram of the components used for processing the data generated by the sensors in accordance with one embodiment of the present invention.

FIG. 13 shows a block diagram 66 of the components used for processing the data generated by the sensors. In order to determine the direction of flow of the meter and the presence of a missing signal, data must be collected from the occurring signal and the previous signal. The calculation of the direction of flow is dependent on data from the occurring signal ("N") that is provided by the four sensor outputs 68 and the data from the previous signal ("N−1") that is stored in the status register memory 72. In this example, the status register memory 72 is a ferro-electric random access memory ("FeRAM"). This type of memory is typically used in mobile applications. The data of the N−1 signal is stored in the memory at a previous address that is indicated by a 2-bit binary value ("PA0 and PA1"). The data of the N signal is stored at a new address ("NA") that is indicated by a 2-bit binary value shown as shown in FIG. 14b. A 1-bit binary value that indicates the last valid direction ("LVD") of the meter flow is also stored in the status register memory 72. The LVD is calculated with the data of the N−1 signal according to the sequence of state indicators.

Data is received from the four channels of the sensor outputs 68 and input into the binary encoder as flow direction inputs as shown in FIG. 14a. When the meter flow is running forward, the repeating sequence of binary address values is shown in FIG. 15a. When the meter is running in reverse, the repeating sequence of binary address values is shown in FIG. 15b.

It is possible for a sensor to miss a signal or simply generate a signal with insufficient energy to be detected by the ASIC. An error in the form of a missing data bit is detected by calculating a temporary 2-bit binary variable called "SUBADD". SUBADD is calculated by subtracting the value of PA from NA. In this embodiment, subtraction is accomplished by two's complement addition. This is a technique that simulates subtraction for binary numbers by adding a negative binary number (i.e., 4+(−2) instead of 4−2). The negative binary number is generated taking the one's complement of the number to be subtracted (i.e., the subtrahend) and adding one to its value to obtain the two's complement of the number. The one's complement is simply the inverted value of the number where all "0"s are changed to "1"s and all "1"s are changed to "0"s. Once the two's complement is obtained, it is added back into the number to be subtracted from (i.e., the minuend) to obtain SUBADD.

As shown in FIG. 16a, when the meter flow is continually running forward, the SUBADD value is always "01". FIG. 16b shows that when the meter flow is running in reverse, the SUBADD value is always "11". When the SUBADD value is "00", there is no change in the values of NA and PA. This indicates the receipt of two consecutive signals on the same input. This is an illegal signal which is ignored by the system. However, if a signal from one of the sensors is missed for any reason, the SUBADD value is always "10". FIG. 17a shows the calculation of the SUBADD values for a missing signal when the meter flow is running forward. FIG. 17b shows the calculation of the SUBADD values for a missing signal when the meter flow is running in reverse.

Once a missed signal is detected, measures to compensate for the error are taken by the system. In the example shown in FIG. 18, a signal is missed on Channel A− without a change in the direction of meter flow. As mentioned previously, the LVD (last valid direction) bit is a 1-bit binary value that indicates the direction the magnet rotated during the previous signal. In this example, an LVD value of "1" indicates a forward or up flow and an LVD value of "0" indicates a reverse or down flow. The "action" indicates the action to be taken with various counters. An action of "+n" means that n will be added to a counter called REG UP that counts up while an action of "−n" means that n will be added to a counter called REG DN that counts down. Each counter will be incremented once for each signal received. The REG DN value will be subtracted from REG UP to determine the value of the net counter called NET.

In FIG. 18, six signals are detected before the seventh signal is missed in the A− channel. The next detected signal comes from the B− channel and causes the state to change from 11 to 10 (A state, B state). At this point, the state change appears (incorrectly) to the system as a change in flow direction. The LVD changes in value from 1 to 0 because of the supposed change of flow direction. The next signal is received from the A+channel. However, the present state is 10 with its most significant bit value set to 1, so it cannot change. This results in the current state having the same value as the previous state. The indication of a current state and a previous state having the same value is an alternative way of detecting a missed signal. When this happens, the system will realize a signal has been missed and compensate. Since the LVD has a value of 0 and the system realizes that every time a signal is missed the flow direction appears to change, the system compensates by adding 4 to the REG UP counter and changes the LVD value back to 1. If the LVD had a value of 1 after the signal had been missed, the system would compensate by adding 4 to the REG UP counter and changes the LVD value back to 0.

Figure 19:
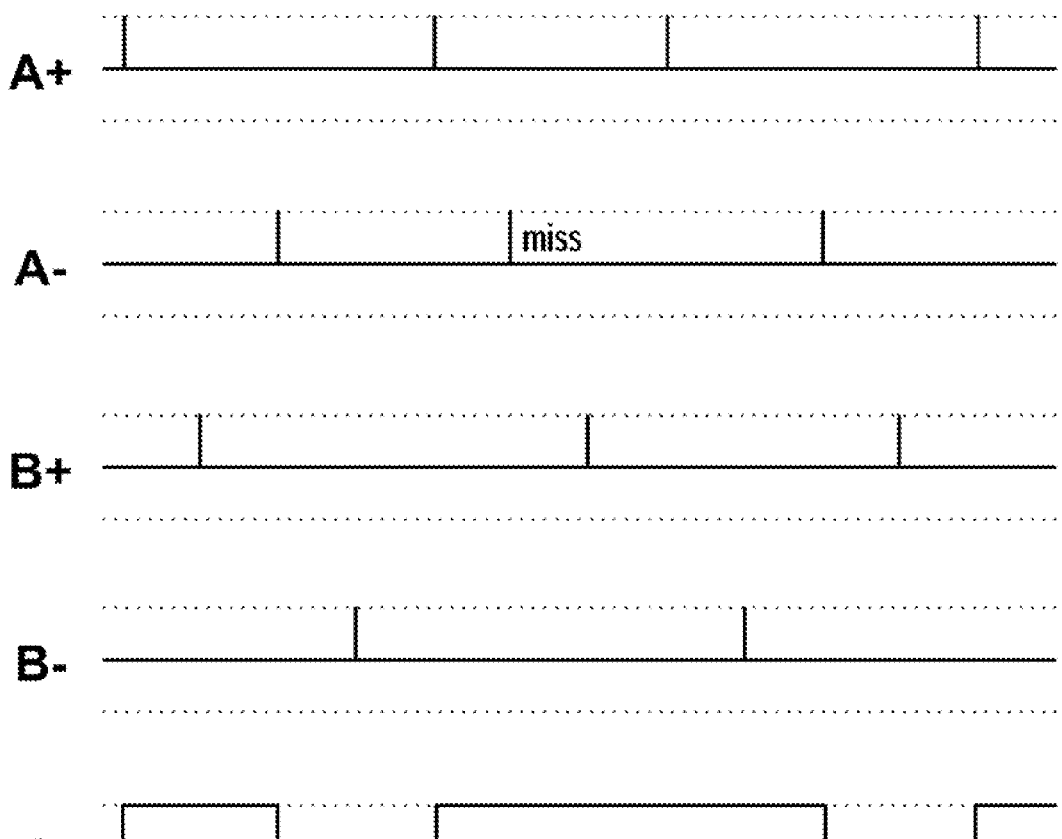
FIG. 19 shows a chart that indicates the states of Sensor A and Sensor B with a missed signal and a change in flow direction in accordance with one embodiment of the present invention.
Figure 20:
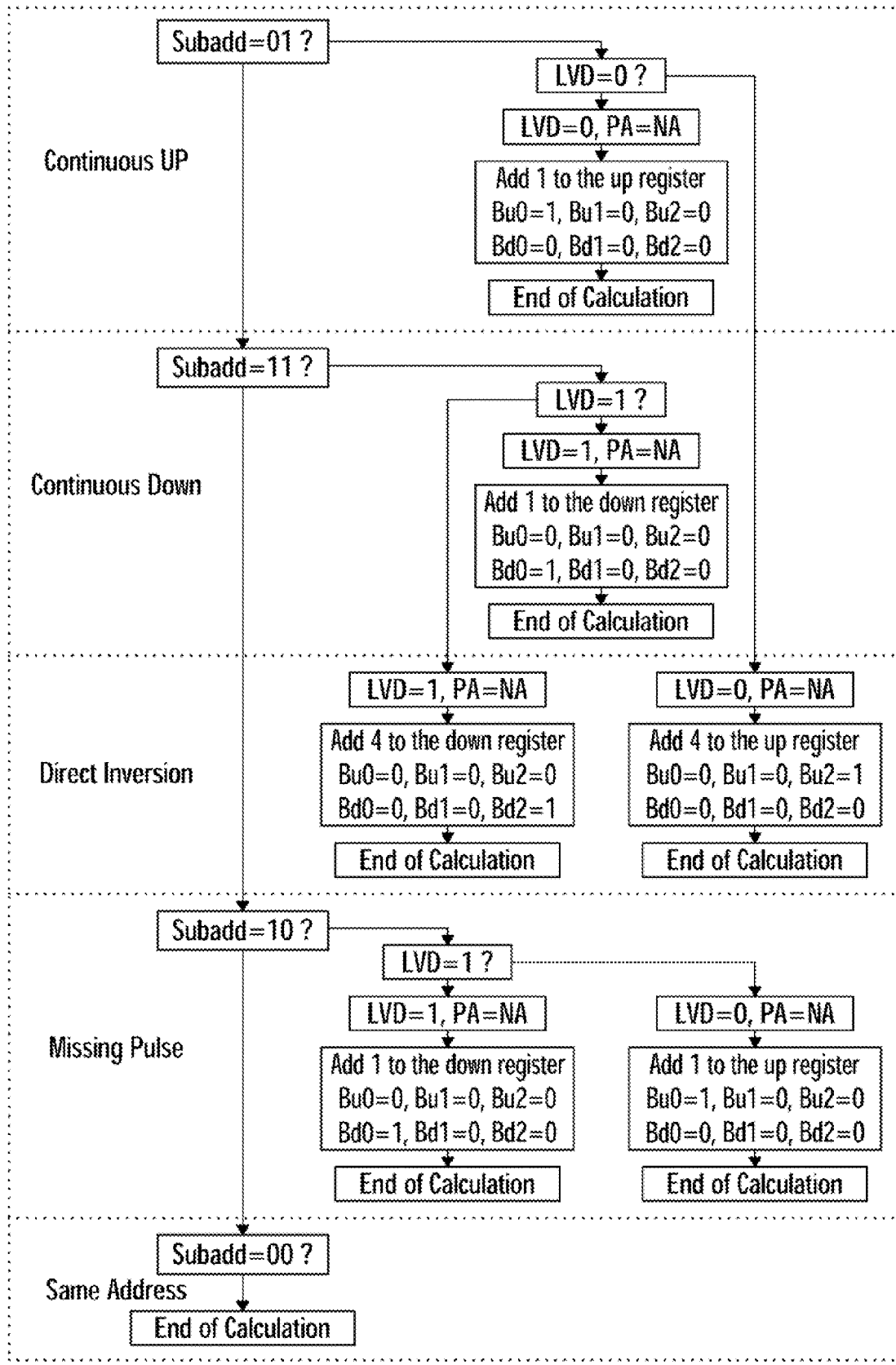
FIG. 20 shows a flow chart that summarizes the operations related to processing signal information in accordance with one embodiment of the present invention.

In the example shown in FIG. 19, a signal is missed on Channel A− with a change in the direction of meter flow. When a change in flow direction occurs, the angle the magnet travels after the last signal may vary considerably. A signal on the A+channel that is followed by a change in direction should theoretically yield a signal on the A− channel. The same basic algorithm described previously for detecting and compensating for a missing signal without a change in direction will also work for detecting and compensating for a missing signal with a change in direction. Specifically, the system will compensate for the missed signal by adding 4 to the REG DN counter. However, since there was a true change of direction the LVD value will not be changed. FIG. 20 shows a flow chart that summarizes these operations related to processing signal information.

Advantages of the present invention include the ability to determine flow direction and detect missing or improper signal sequences in sensor output regardless of the cause of the error. Another advantage of the system includes the ability of the system to compensate for an error in signal detection in both instances of a change in flow direction and no change in flow direction.

While the invention has been described with respect to a limited number of embodiments, those skilled in the art, having benefit of this disclosure, will appreciate that other embodiments can be devised which do not depart from the scope of the invention as disclosed here. Accordingly, the scope of the invention should be limited only by the attached claims.

What is claimed is:

1. A method for correcting data signal errors in a meter, comprising:
   receiving ordered data signals from the meter;
   analyzing the sequence of the ordered data signals to detect a missing data signal by calculating a temporary 2-bit binary variable based on a present data signal and a previous data signal in the sequence of ordered data signals;
   correcting the value of a last valid direction indicator that indicates flow direction in the meter, and
   compensating for the missing data signal by adding a predetermined value to a sequence counter.

2. The method of claim 1, where values related to the previous data signal are stored in a status register.

3. The method of claim 2, where the status register is a non-volatile memory component.

4. The method of claim 3, where the non-volatile memory component is a ferro-electric random access memory component.

5. The method of claim 1, where the variable is calculated by subtracting a binary value of the previous data signal from a binary value of the present data signal.

6. The method of claim 5, where the subtracting is done by adding the two's complement of the binary value of the previous data signal to the binary value of the present data signal.

7. The method of claim 1, where a missing data signal is detected by determining whether a binary state value for a present data signal is the same as a binary state value for a previous data signal.

8. The method of claim 1, where the sequence counter counts up.

9. The method of claim 1, where the sequence counter counts down.

10. A method for detecting errors in a meter, comprising:

step for receiving a sequence of data signals of the meter;

step for analyzing the sequence of data signals to detect a missing data signal by calculating a temporary 2-bit binary variable based on a present data signal and a previous data signal in the sequence of ordered data signals;

correcting the value of a last valid direction indicator that indicates flow direction in the meter, and step for compensating for a missing data signal by adding a predetermined value to a sequence counter.

\* \* \* \* \*